United States Patent [19]
Matsui et al.

[11] Patent Number: 6,060,344
[45] Date of Patent: May 9, 2000

[54] METHOD FOR PRODUCING A SEMICONDUCTOR SUBSTRATE

[75] Inventors: Masaki Matsui, Nagoya; Masatake Nagaya, Seto; Hisayoshi Ohshima, Ohbu, all of Japan

[73] Assignee: Denso Corporation, Kariya, Japan

[21] Appl. No.: 09/136,294

[22] Filed: Aug. 19, 1998

[30] Foreign Application Priority Data

Aug. 20, 1997 [JP] Japan .................................. 9-223527

[51] Int. Cl.$^7$ .................................. H02L 21/20
[52] U.S. Cl. .................. 438/164; 438/164; 438/412; 438/165; 438/413; 257/352; 257/353; 257/354
[58] Field of Search .................. 437/100, 902, 437/915, 61, 62; 357/16, 60, 61; 428/220; 438/352, 353, 354

[56] References Cited

U.S. PATENT DOCUMENTS

| | | | |
|---|---|---|---|
| 5,043,773 | 8/1991 | Precht et al. | 357/16 |
| 5,190,890 | 3/1993 | Precht et al. | 437/100 |
| 5,314,107 | 5/1994 | D'Aragona et al. | 228/116 |
| 5,407,856 | 4/1995 | Quenzer et al. | 437/61 |
| 5,441,803 | 8/1995 | Meissner | 428/220 |
| 5,964,942 | 10/1999 | Tanabe et al. | 117/87 |

FOREIGN PATENT DOCUMENTS

| | | |
|---|---|---|
| 0136050 | 8/1984 | European Pat. Off. . |
| 2-177433 | 7/1990 | Japan . |
| 2-267949 | 11/1990 | Japan . |
| 5-226463 | 9/1993 | Japan . |

*Primary Examiner*—Charles Bowers
*Assistant Examiner*—Laura Schillinger
*Attorney, Agent, or Firm*—Pillsbury Madison & Sutro LLP

[57] ABSTRACT

In a method for producing a semiconductor substrate completed through a bonding process for joining a semiconductor wafer to a support substrate by performing heat treatment thereto in a state in which the semiconductor wafer is closely joined to the support substrate, the method according to the present invention includes the following steps, i.e., a depositing process for depositing a poly-crystal semiconductor which covers all areas of a surface to be bonded on the surface of the semiconductor wafer; a heat treatment process for performing the heat treatment to the semiconductor wafer provided after the depositing process, during a predetermined time under a temperature equal to or higher than the heat treatment temperature at the bonding process; and a polishing process for flattening the surface of the poly-crystal semiconductor provided after the heat treatment process. After the above processes were performed in order, the bonding process is performed after the polishing process.

33 Claims, 10 Drawing Sheets

METHOD FOR PRODUCING A SEMICONDUCTOR SUBSTRATE

BACKGROUND OF THE INVENTION

1. Field of the Invention

The present invention relates to a method for producing a semiconductor substrate, utilizing a bonding technique, used for a semiconductor wafer.

2. Description of the Related Art

For example, as a method for bonding two silicon wafers used when producing a silicon substrate having a multilayer structure, there is the following known method, i.e., after the surface treatment was performed to two mirror-polished silicon wafers (i.e., mirror-surface wafers), in a state that two silicon wafers are closely joined, heat treatment is performed to two silicon wafers at high temperature in order to strengthen the joint, and, as a result, two silicon wafers are forcedly bonded to one another.

There are problems, however, in this method as explained below, that is, when a thin film consisting of different material provided by a patterning process is formed on the joined surface of the silicon wafer, or when trench patterns provided by an etching process are formed on the surface of the silicon wafer, the bonding becomes insufficient due to the unevenness (i.e., difference in grade) on the surface at the boundary of the join.

In order to solve the above problems, there is the following known method, i.e., after the deposition of a poly-crystal silicon on the bonding surface of the silicon wafer, the unevenness of the surface of the silicon wafer is covered by the poly-crystal silicon having a flat surface (i.e., mirror surface) obtained by polishing the surface flat and, the bonding process is performed in a state which is covered by the poly-crystal silicon.

In general, the process for depositing the poly-crystal silicon is performed at high temperature (usually, around 1200° C.) by utilizing the normal pressure CVD (Chemical Vapor Deposition) method. In this case, since the thick poly-crystal silicon can be deposited at high speed, there is an advantage that it is possible to ensure a large cutting portion in the polishing process (in some cases, a grinding process may be provided before the polishing process). Further, there is another advantage that it is possible to improve the throughput in the depositing process.

There are problems, however, in the above method as explained below. That is, when the unevenness of the silicon wafer is formed by the trench pattern having narrow and deep shape, i.e., having a high aspect ratio, it is very difficult to completely bury the trench pattern by using the normal pressure CVD method.

On the other hand, there is a pressure reducing CVD method as one example of a depositing method which can completely bury a trench having high aspect ratio (i.e., deep trench) by using poly-crystal silicon. As a film-making conditions, when employing the pressure reducing CVD method, it is possible to obtain a good burying characteristics in conditions which suppressed growth speed, i.e., at low pressure and low temperature (e.g., 650° C. or less).

That is, when the film is made at the conditions of normal pressure, high temperature and high speed, the upper portion of the trench is closed by the poly-crystal silicon at an initial step of the filmmaking so that a cavity may occur in an inner portion of the trench. However, according to the conditions which suppressed the growth speed, there is no cavity in the inner portion of the trench.

When bonding the silicon wafer for supporting another silicon wafer of the poly-crystal silicon processed by the film-making process and the grinding process, a hydrophilic process is performed to the bonded surface. In the hydrophilic process, for example, each silicon wafer is dipped into the mixed solution of the sulfuric acid and hydrogen peroxide which are maintained to a predetermined temperature, and an oxide film having a thickness of about several nanometers is formed on the surface of the silicon (i.e., the poly-crystal silicon) in order to obtain the hydrophilic property.

Further, after the above processes, the silicon wafer is dipped into super-pure water in order to obtain the hydrogen binding from the hydroxyl group and the water molecule, which are absorbed on the oxide film, so that two silicon wafers are closely joined one another. Finally, the heat treatment is performed to the joined portion of two silicon wafers so that it is possible to obtain the strong binding (i.e., covalent binding).

When the heat treatment in the bonding process is performed at high temperature (e.g., 1000° C. or more), it is possible to obtain a good joined state without a void (i.e., non-joined area). When the heat treatment is performed at the low temperature (e.g., 800° C. or less), there are many joint failures in which the silicon wafers, which are closely joined to one another, break away and many large voids occur although the join is maintained. It is assumed that, as the reason of the above, the gas (for example, aqueous vapour) which occurred on the bonding surface of the silicon wafer is not diffused in the heat treatment at low temperature.

Accordingly, from the above viewpoint, in order to realize the good bonding state between two silicon wafers, it is considered that the high temperature at the heat treatment is preferable when the bonding process is performed. However, when the heat treatment at the high temperature is performed for the bonding process, there are some join failures. Therefore, the inventors of the present invention had some experiments and considerations in order to clarify the reasons of join failure as explained in detail hereinafter.

SUMMARY OF THE INVENTION

The object of the present invention is to provide a method for producing a semiconductor substrate which can effectively prevent an occurrence of joint failure caused by unevenness existing on the surface of the silicon wafer when bonding the semiconductor wafer to the support substrate.

In accordance with a first aspect of the present invention, there is provided a method for producing a semiconductor substrate completed through a bonding process for joining a semiconductor wafer to a support substrate by performing heat treatment thereto in a state in which the semiconductor wafer is closely joined to the support substrate, the method comprising the steps of; a depositing process for depositing a poly-crystal semiconductor which covers all of a surface to be bonded to the surface of the semiconductor wafer; a heat treatment process for performing the heat treatment to the semiconductor wafer provided after the depositing process, during a predetermined time under a temperature equal to or higher than the heat treatment temperature at the bonding process; and a polishing process for flattening the surface of the poly-crystal semiconductor provided after the heat treatment process; wherein the above processes are performed in order, and the bonding process is performed after the polishing process.

In accordance with a second aspect of the present invention, there is provided a method for producing a semiconductor substrate completed through a bonding process for joining a semiconductor wafer to a support substrate by performing heat treatment thereto in a state in which the semiconductor wafer is closely joined to the support substrate, the method comprising the steps of; a first depositing process for depositing a poly-crystal semiconductor which covers all of a surface to be bonded on the surface of the semiconductor wafer; a heat treatment process for performing the heat treatment to the semiconductor wafer provided after the first depositing process, during a predetermined time under a temperature equal to or higher than the heat treatment temperature at the bonding process; a polishing process for flattening the surface of the poly-crystal semiconductor provided after the heat treatment process; a second depositing process for depositing a second poly-crystal semiconductor which covered the surface of the poly-crystal semiconductor provided after the polishing process; and a final polishing process for flattening the surface of the second poly-crystal semiconductor provided after the second depositing process; wherein the above processes are performed in order, and the bonding process is performed after the final polishing process.

In accordance with a third aspect of the present invention, there is provided a method for producing a semiconductor substrate completed through a bonding process for joining a semiconductor wafer to a support substrate by performing heat treatment thereto in a state in which the semiconductor wafer is closely joined to the support substrate, the method comprising the steps of; a depositing process for depositing a poly-crystal semiconductor which covers all of a surface to be bonded on the surface of the semiconductor wafer; a polishing process for flattening the surface of the poly-crystal semiconductor provided after the depositing process; a heat treatment process for performing the heat treatment to the semiconductor wafer provided after the polishing process, during a predetermined time under a temperature equal to or higher than the heat treatment temperature at the bonding process; and an additional polishing process for flattening again the surface of the poly-crystal semiconductor provided after the heat treatment process; wherein the above processes are performed in order, and the bonding process is performed after the polishing process.

In a preferred embodiment, in the depositing process, the poly-crystal semiconductor is deposited under a temperature lower than the heat treatment temperature at the bonding process.

In another preferred embodiment, the heat treatment time at the heat treatment process is set to the time longer than a saturation time of a migration caused by a large particle of the poly-crystal semiconductor.

In still another preferred embodiment, the heat treatment temperature at the bonding process is set to a temperature higher than 1000° C.

In still another preferred embodiment, both poly-crystal semiconductors provided before and after the heat treatment are formed by a poly-crystal silicon, and a temperature for depositing at the depositing process is set to the temperature of 900° C. or less.

In still another embodiment, the heat treatment temperature at the heat treatment process is set to 1150° C., and the heat treatment time is set to 5 to 10 hours or longer.

In still another preferred embodiment, a forming process for providing a flattened process film having fluidity is performed on the surface of the poly-crystal semiconductor provided after the polishing process.

In still another preferred embodiment, the forming process for providing the flattened process film having the fluidity is performed on the surface of the support substrate before the bonding process.

In still another preferred embodiment, the support substrate is formed by an isolation material.

In still another preferred embodiment, a method for producing a semiconductor substrate further comprises a second depositing process for depositing the second poly-crystal semiconductor on the surface of the poly-crystal semiconductor provided after the additional polishing process; and a final polishing process for flattening the surface of the second poly-crystal semiconductor of the semiconductor wafer provided after the second depositing process; wherein the above processes are performed in order, and the the bonding process is performed after the final polishing process.

In still another preferred embodiment, a method for producing a semiconductor substrate further comprises a second depositing process for depositing the second poly-crystal semiconductor on the surface of the poly-crystal semiconductor of the semiconductor wafer without the additional polishing process after the heat treatment process; and a final polishing process for flattening the surface of the second poly-crystal semiconductor of the semiconductor wafer provided after the second depositing process; wherein the above processes are performed in order, and the bonding process is performed after the final polishing process.

DESCRIPTION OF THE PREPERRED EMBODIMENTS

The present invention will be explained in detail with reference to the attached drawings.

Figure 4A:
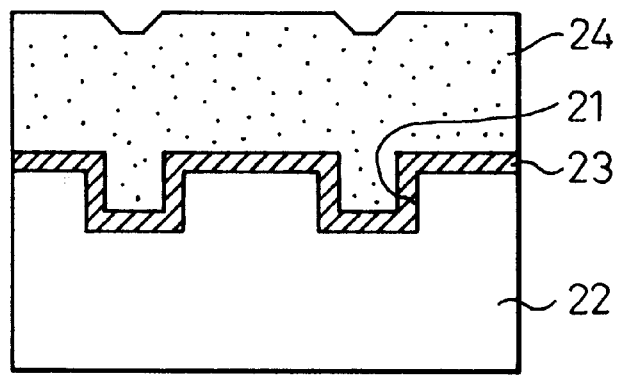
FIGS. 4A to 4E are schematic sectional views for explaining basic processes for producing a silicon substrate with a SOI (Silicon On Insulator) by using a bonding method.

FIGS. 4A to 4E are schematic sectional views for explaining basic processes for producing a silicon substrate with a SOI (Silicon On Insulator) by using a bonding method. As shown in FIG. 4A, the poly-crystal silicon 24 was formed on the silicon wafer 22 through the silicon oxide film 23 provided on the surface thereof. Further, the silicon wafer 22 has the trench 21 which has, for example, a width=1 $\mu$m, a depth=2 $\mu$m, and an aspect ratio=2.

Figure 4B:
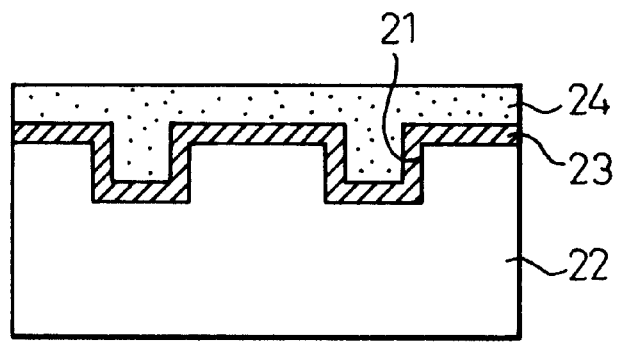

It should be noted that this drawing does not show the precise relationship of size. The film of the poly-crystal silicon was made by using the pressure reducing CVD method at the low temperature (i.e., 650° C.). Still further, as shown in FIG. 4B, the surface of the poly-crystal silicon 24 was polished flatly in order to obtain the mirror polished surface.

Figure 4C:
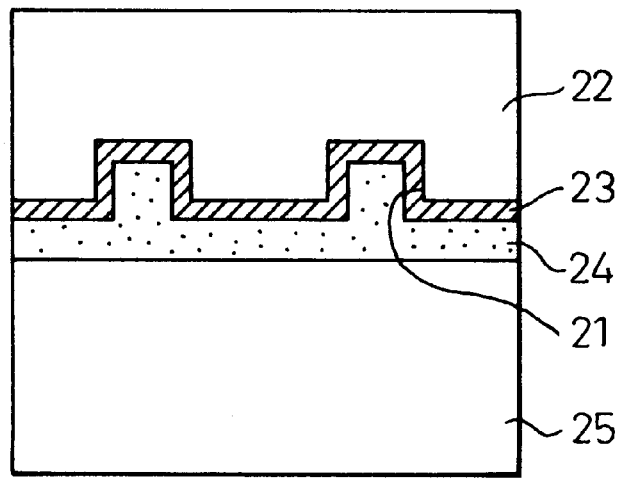

As shown in FIG. 4C, after the hydrophilic process was provided to both surfaces of the silicon wafer 22 and the surface of the support silicon wafer 25 which was already mirror-polished, the silicon wafer 22 and the support silicon wafer 25 were closely joined by the hydrophilic process on both surfaces. Further, both silicon wafers 22 and 25 were bonded by the heat treatment of 1150° C. per one hour.

Figure 4D:
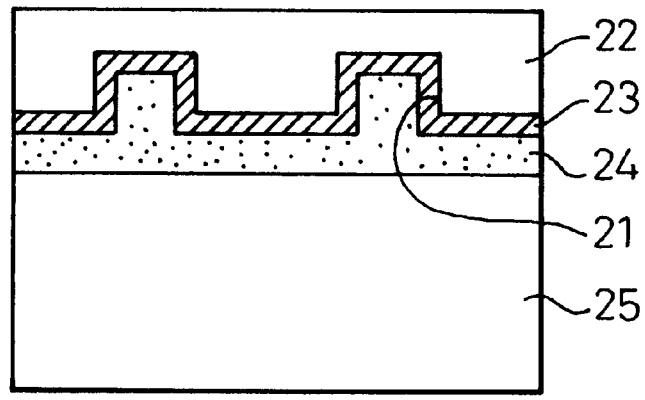

Still further, as shown in FIG. 4D, the surface of the silicon wafer 22 was ground in order to obtain a relatively small thickness thereof, until just before the bottom of the trench 21 was found, from the surface of the silicon wafer 22. As a result of the grinding process, as shown in FIG. 4E the silicon wafer 22 remained only at the portion corresponding to the surface area of the trench 21 and joined thereto, and another area of the silicon oxide film 23 (below, this is called "surface area") was broken away from the surface.

Figure 4E:
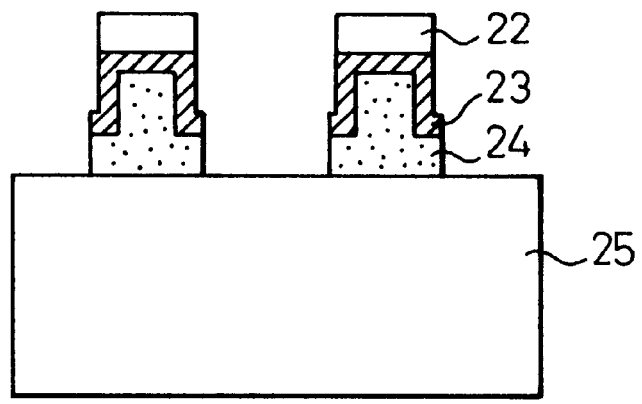

The inventors of the present invention made various experiments in order to clarify the above phenomenon of FIG. 4E. After repetition of some experiments, the inventors came to the following conclusion, i.e., the reason of the above phenomenon lies in the heat treatment at high temperature when performing the bonding process.

Figure 5:
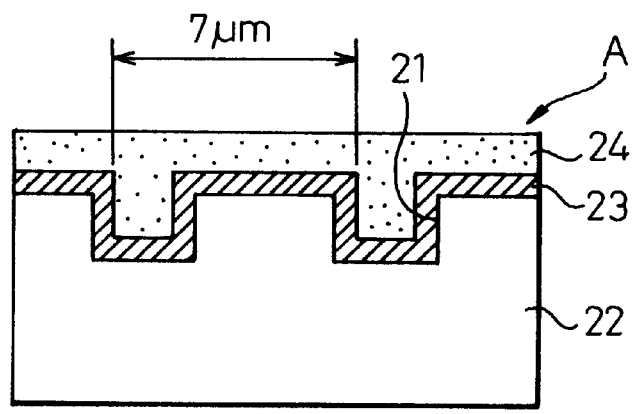
FIG. 5 is an explanatory view for explaining a result of an experiment by the inventors.

FIG. 5 is an explanatory view for explaining a result of an experiment by the inventors. After the silicon oxide film 23 and the poly-crystal silicon 24 were formed on the silicon wafer 22 having two trenches 21 (each having a width=1 μm and a depth=2 μm, and the space between trenches=7 μm), the flat polishing process was performed for the poly-crystal silicon 24 (This is called "sample A").

Further, the heat treatment was performed to the sample A in accordance with the same conditions (i.e., 1150° C. per one hour) as the heat treatment at the bonding process. In the above situation, the inventor checked the change of difference in grade of the surface of the poly-crystal silicon 24 before and after the heat treatment.

Figure 6:
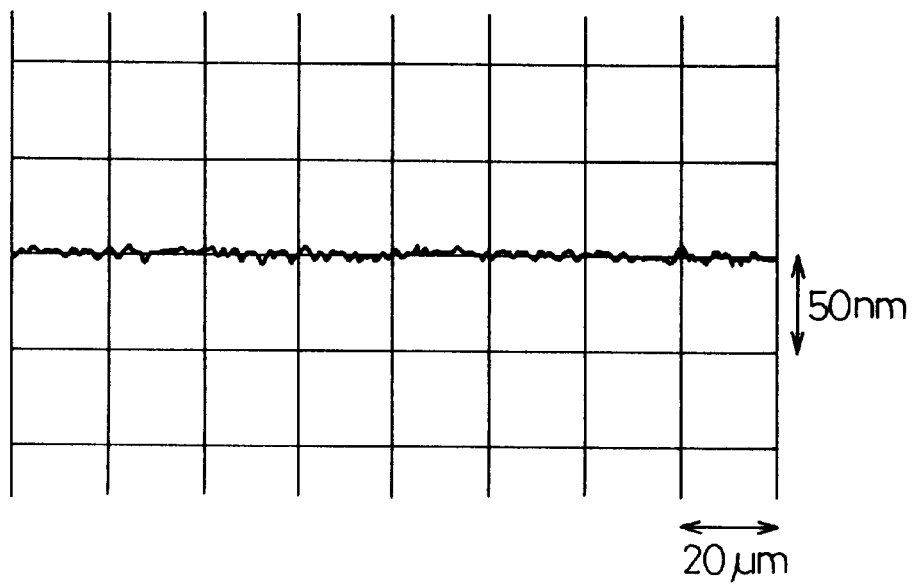
FIG. 6 is a graph for explaining the difference in grade of the surface before the heat treatment.
Figure 7:
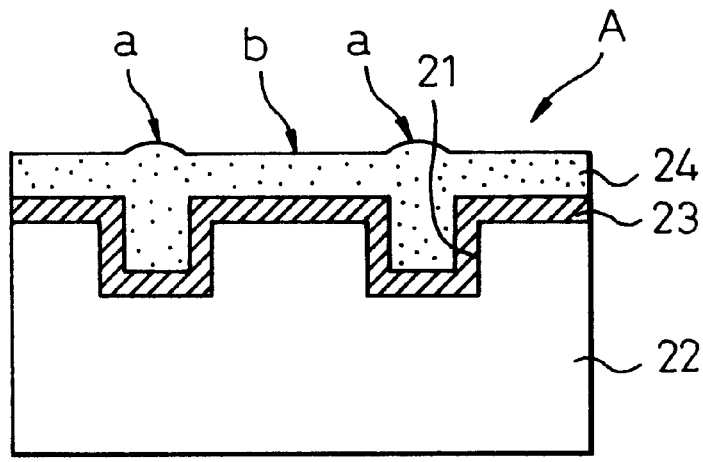
FIG. 7 is an explanatory view for explaining the difference in grade on the surface.
Figure 8:
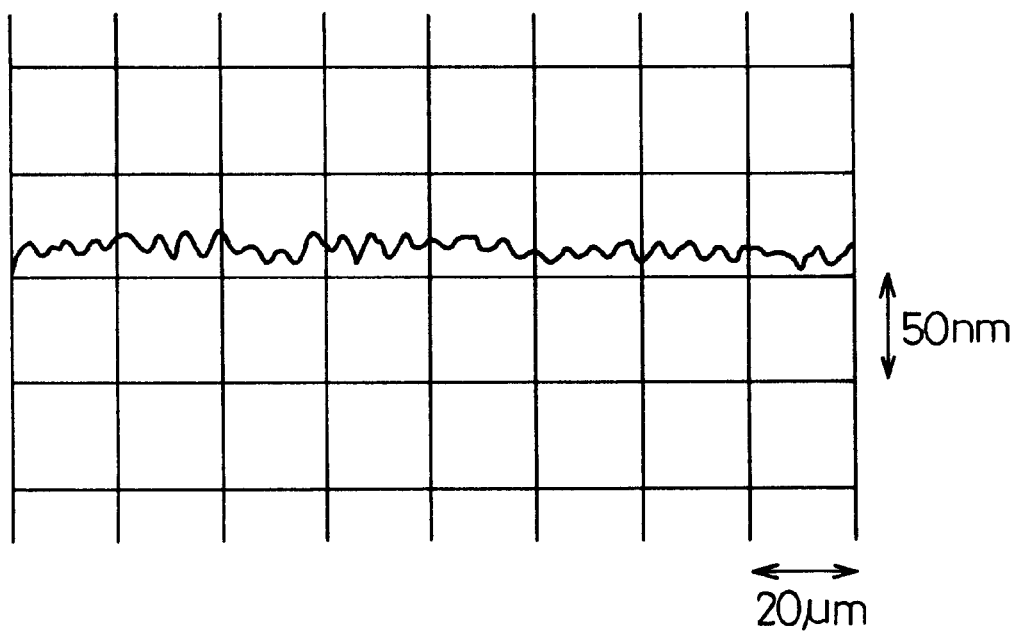
FIG. 8 is a graph for explaining the difference in grade of the surface after the heat treatment.

FIG. 6 is a graph for explaining the difference in grade of the surface before the heat treatment, FIG. 7 is an explanatory view for explaining the difference in grade on the surface, and FIG. 8 is a graph for explaining the difference in grade of the surface after the heat treatment.

As shown in FIG. 6, although there were very small unevenness (i.e., small difference in grade) on the surface of the poly-crystal silicon 24 before the heat treatment, there were relatively large unevenness on the surface, particularly, above both trenches 21 as shown in FIG. 7. In this case, the space of the unevenness is 7 μm, and the difference between high and low portions of the unevenness is about ±5 nm.

As is obvious from the above explanations, the difference in grade occurs again on the surface of the poly-crystal silicon 24, which was flattened by the polishing process, after the high heat treatment. Accordingly, it is considered that only convex portions "a" of the difference in grade (i.e., surface ranges above two trenches 21) are joined with the support silicon wafer 25 (see FIGS. 4C and 4D), and the remaining portion (i.e., concave portion) "b" is joined insufficiently with the support silicon wafer 25 so that the silicon wafer 22 is broken away from the support silicon wafer 25 (see FIG. 4E).

The occurrence of the difference in grade on the surface is caused by a so-called "large particle phenomenon" (i.e., due to the rearrangement of crystal) of the poly-crystal silicon 24 with the heat treatment at the high temperature. In this case, the poly-crystal silicon 24 formed at the low temperature has a crystal growth which is called "columnar crystal" of which the "110" axis is perpendicular to the ground.

In this case, in the poly-crystal silicon 24 provided within the trench 21, since there are portions in which the side wall of the trench 21 is used as the ground, the direction of the crystal axis (i.e. the "110" axis) of the poly-crystal silicon at that portions has the different angle from the crystal axis (i.e., "110" axis) of the poly-crystal silicon 24 formed on the surface of the silicon wafer 22.

That is, when the side wall of the trench 21 is formed orthogonally to the surface of the silicon wafer 22, the direction of the "110" axis is different from 90° between the poly-crystal silicon 24 within the trench 21 and the poly-crystal silicon 24 on the surface of the silicon wafer 22.

When the heat treatment is performed on the poly-crystal silicon 24 at the high temperature, the migration occurs and the poly-crystal silicon 24 proceeds from the columnar crystal to the particle-shaped crystal (i.e., the large particle phenomenon occurs). Accordingly, as explained above, in the poly-crystal silicon 24, since the direction of the "110" axis is different from 90° between the inside of the trench 21 and the surface, and since the large particle phenomenon occurs in the closed area within the trench 21, the process of the crystal growth in which the poly-crystal silicon 24 becomes the large particle is different between the inside of the trench 21 and the surface.

As a result, the convex portions "a" occur on the surface, i.e., above the trench 21 as shown in FIG. 7. The above is the reason of the convex portions "a" in FIG. 7, and the unevenness of the graph in FIG. 8. It is considered that the unevenness on the surface of the poly-crystal silicon 24, which occurred due to the above processes, becomes the cause of joint failure when bonding the silicon wafer 22 to the support silicon wafer 25 at the high temperature heat treatment.

As is obvious from the above explanations, the present invention aims to effectively prevent occurrence of the joint failure caused by the unevenness on the surface when bonding the semiconductor wafer to the support substrate.

The following explanations are given to several embodiments according to the present invention with reference to FIGS. 1A to 3H. The present invention was applied to the method for producing the dielectric isolation substrate having the SOI (Silicon On Insulator) structure.

A first embodiment according to the present invention is explained in detail below.

FIGS. 1A to 1G show schematic producing processes of the semiconductor substrate according to the first embodiment of the present invention.

In the etching process shown in FIG. 1A, the surface of the first single crystal silicon wafer 1 which was mirror-polished (this corresponds to the semiconductor wafer according to the present invention, and this is called "first wafer" below) is etched by selectively using a wet etching, an reactive ion etching (RIE), or a dry etching, so that the concave portion 2 having the depth 0.1 to 5 μm is formed on the surface of the first wafer 1. Further, by using the same etching method, the trench 3 having relatively high aspect ratio, i.e., the width is 0.5 to 3 μm, and the depth is 1 to 20 μm, is formed on the surface of the first wafer 1. As a result, the unevenness is formed on the surface of the first wafer 1.

Figure 1A:
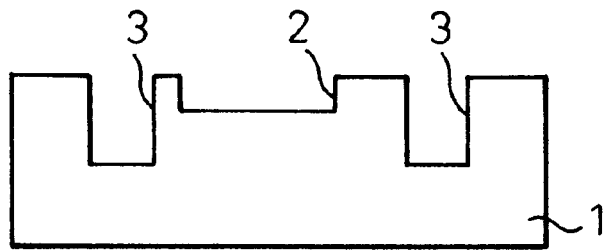
FIGS. 1A to 1G show schematic producing processes of the semiconductor substrate according to the first embodiment of the present invention.
Figure 1B:
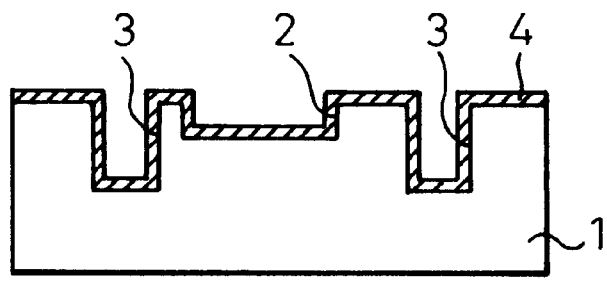

In the film-making process shown in FIG. 1B, the silicon oxide film 4 is formed on the surface of the first wafer 1 by using a thermal oxidation or a CVD (Chemical Vapor Deposition) method.

Figure 1C:
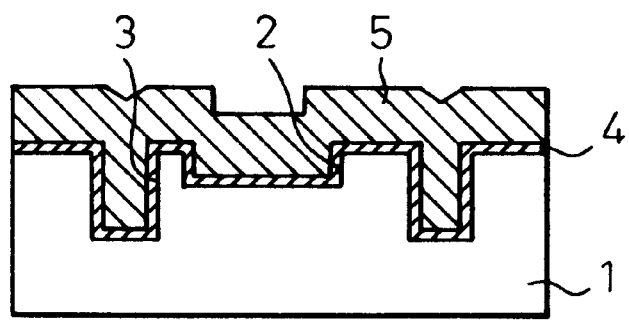

In the depositing process shown in FIG. 1C, after the above processes, the poly-crystal silicon 5 (this corresponds to the poly-crystal semiconductor) is deposited on the silicon oxide film 4 by using the LPCVD method. This deposition is performed under the following conditions, i.e., the low pressure and low temperature (e.g., 900° C. or less, preferably 650° C. or less) in which the growth speed is suppressed.

Based on this conditions, it is possible to obtain a state in which the concave portion 2 and the trench 3 having relatively high aspect ratio were completely covered by the poly-crystal silicon 5 (i.e., a state in which there is no cavity). In this case, the unevenness is formed on the surface of the poly-crystal silicon 5 caused by the unevenness of the surface of the first wafer 1.

Before the depositing process, it is possible to provide a structure which forms the film having different materials, functioning as a wire, by selectively etching after the deposition of the poly-crystal silicon doped by the impurity, such as phosphorus, the oxide film, and the nitriding film. In the above structure, the unevenness is also formed on the surface of the first wafer 1.

Figure 1D:
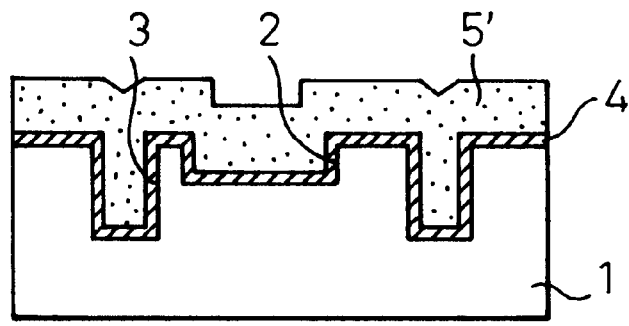

In the heat treatment process shown in FIG. 1D, the poly-crystal silicon 5 can be changed to the poly-crystal silicon 5' having the particle-like crystal by changing the poly-crystal silicon 5 to the large particle when performing the heat treatment at the high temperature. It is necessary to set the temperature at that time to the temperature which is at least equivalent to or higher than the heat treatment temperature at the boding process performed hereinafter.

Concretely, for example, when the temperature of the heat treatment at the bonding process is 1100° C., the temperature of the heat treatment at the process shown in FIG. 1D is 1150° C. Further, it is desirable to set the time for the heat treatment to the time longer than when the migration of the poly-crystal silicon 5 is saturated (below, the saturation time). Accordingly, the time of the optimum heat treatment is determined based on the previous consideration in accordance with the depositing conditions of the poly-crystal silicon 5 and the structure of the trench 3. In this embodiment, the time of the optimum heat treatment is set to 5 to 10 hours.

Figure 1E:
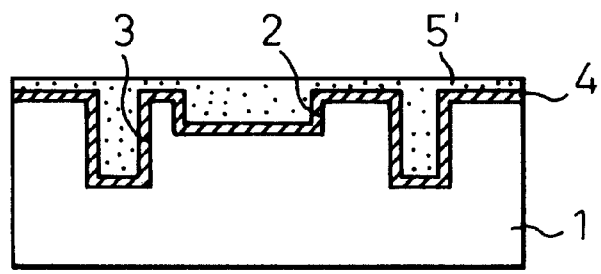
Figure 1F:
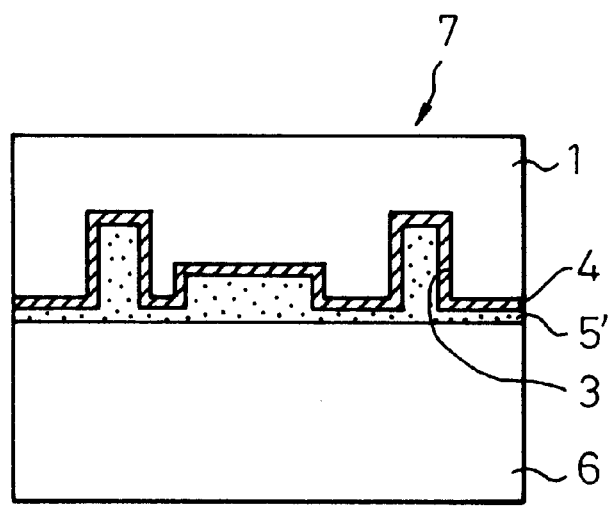

In the polishing process shown in FIG. 1E, the surface of the poly-crystal silicon 5' is flattened by using the chemical and mechanical polishing (CMP) method, and the unevenness on the surface of the poly-crystal silicon 5' is eliminated so that it is possible to obtain the flat surface (i.e., the mirror-surface) having no difference in grade on the surface of the poly-crystal silicon 5'. In this case, it is possible to obtain an effective polishing process with small polishing amount, by using the hard material as the polishing cloth.

After the polishing process, the hydrophilic process (not shown) is performed to the surface of the poly-crystal silicon 5' and the surface of the second single crystal silicon wafer 6 which is mirror-polished (this corresponds to the support substrate shown in FIG. 1F, and is called the second wafer), in order to give the hydrophilic property to the surface.

In this hydrophilic process, the first wafer 1 and the second wafer 6 are dipped into the mixed solution consisting of the sulfuric acid and the hydrogen peroxide (for example, $H_2SO_4:H_2O_2=4:1$) maintained at the predetermined temperature, or the oxide layer having the thickness of 1 to 100 nm is formed on the surface of each wafer 1 and 6 in order to have the hydrophilic property by using an oxygen plasma-irradiating method and the layer is cleaned by using super-pure water. Next, the surface is dried by using, for example, a spin-dryer, in order to control water content absorbed on the surface of each wafer 1 and 6. Then, the wafers are moved to the bonding process shown in FIG. 1F.

In the bonding process, first, the surface of the first water 1 (i.e., the surface (i.e., mirror-surface) of the poly-crystal silicon 5') and the surface (i.e., mirror-surface) of the second wafer 6 are closely joined to each other. After this process, the wafers 1 and 6 are adhered to each other based on the hydrogen binding by the silanol group formed on the surface and the water absorbed on the surface.

After the above process, the heat treatment is performed, for example, in the inactive gas, such as the nitrogen gas, or in the oxidant gas, for one hour at 1100° C. After this process, the dehydrating condensation reaction occurs in the adhered surfaces of the first wafer 1 and the second wafer 6, and the waters 1 and 6 are directly adhered each other so that they are integrated. As a result, the joined substrate 7 having the SOI structure is formed.

Figure 1G:
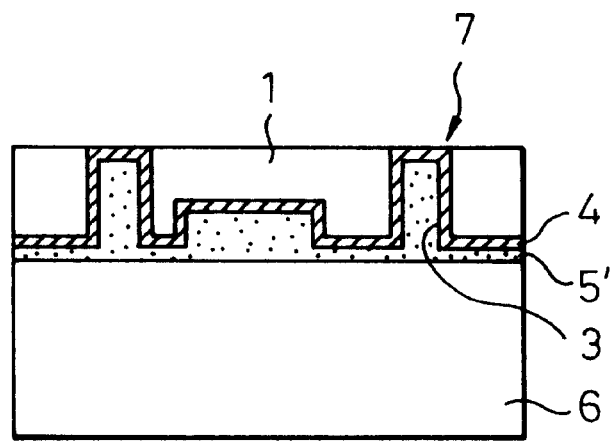

Next, in the grinding and polishing process shown in FIG. 1G, the surface of the first wafer 1 of the joined substrate 7 is ground until just before the trench 3 is exposed. From the above state, the selective polishing is performed so that the trench 3 is exposed. In this case, the silicon oxide film 2 of the trench 3 is functioned as a stopper in the polishing process.

By performing the above processes, it is possible to produce the SOI substrate (i.e., semiconductor substrate) having the state in which the single crystal silicon (i.e., the first wafer 1) was separated from the silicon oxide film 2 by the dielectric isolation.

Briefly, the feature of the above producing method in this embodiment lies in that the heat treatment process and the polishing process are performed before the bonding process which performs the heat treatment by closely joining the first wafer 1 and the second wafer 6. In this case, the heat treatment process is performed at the temperature (e.g., 1150° C.) higher than the temperature (e.g., 1100° C.) of the heat treatment at the bonding process, and over the time (e.g., 5 to 10 hours) when the migration caused by the large particle of the poly-crystal silicon 5 is saturated.

Further, in the polishing process, the surface (i.e., the bonded surface) of the poly-crystal silicon 5 having a state in which the migration is saturated, is flattened to the mirror-like surface.

As a result, the migration of the poly-crystal silicon 5 is saturated in the heat treatment process, and the migration of the poly-crystal silicon 5 does not occur in the heat treatment at the bonding process which is performed hereinafter. Accordingly, even if the unevenness (i.e., the concave portion 2 and the trench 3) exists on the bonding surface of the first wafer 1, the unevenness does not occur on the surface of the poly-crystal silicon 5, which is disposed on the boding surface, in accordance with the heat treatment at the bonding process.

According to the above process, the areas which are not joined (i.e., a non-joined area) do not occur on the bonding surface between the first wafer 1 and the second wafer 6. As a result, when the first wafer 1 and the second wafer 6 are bonded to each other, it is possible to prevent the occurrence of the junction failure caused by the unevenness due to the pattern structure formed on the first wafer 1.

Particularly, in this embodiment, since the depositing temperature of the poly-crystal silicon 5 at the depositing process is set to the temperature (e.g., 900° C. or less, preferably 650° C. or less) lower than the heat treatment temperature (e.g., 1100° C.) at the bonding process, there is the advantage that the growth speed of the poly-crystal silicon 5 is suppressed and the characteristic of burying the poly-crystal silicon is good.

In this case, there is a problem in which the poly-crystal silicon 5 deposited under the above conditions of temperature has a large migration. However, as mentioned above, in this embodiment, since the migration of the poly-crystal silicon 5 is saturated at the heat treatment process, it is possible to solve the above problem.

In this embodiment, although the heat treatment time at the heat treatment process was set to the time longer than the saturation time of the migration of the poly-crystal silicon 5, if the migration of the poly-crystal silicon 5 can be suppressed within a predetermined range, it is possible to provide a structure having the time shorter than the saturation time.

According to this structure, in the bonding process, since the migration of the poly-crystal silicon 5' is suppressed, it is possible to considerably suppress the occurrence of unevenness on the surface of the poly-crystal silicon 5' when performing the heat treatment at the bonding process. As a result, as mentioned above, it is possible to effectively prevent the occurrence of the joint failure, and to improve the throughput at the heat treatment.

Further, in this embodiment, before the hydrophilic process and the bonding process, it is possible to provide the forming process of the flattened process film which has the heat fluidity and is formed by thickness of 0.1 to 2 μm on the surface (i.e., the surface of the poly-crystal silicon 5') of the first wafer 1 or the surface of the second wafer 6.

As for this flattened process film, it is possible to utilize boron-doped phosphor silicate glass (BPSG), phosphor silicate glass (PSG), spin on glass (SOG), etc., except for a silicon oxide film produced by thermal oxidation.

When the forming process of the flattened process film was performed, even if there is a state in which the migration of the poly-crystal silicon 5 is not a completely saturated state due to the heat treatment at the heat treatment process, i.e., even if there is the state which the unevenness occurs on the surface (i.e., bonding surface) of the poly-crystal silicon 5' with the heat treatment at the final bonding process (for example, in the case that the heat treatment time is set to the shorter time at the heat treatment process), the small unevenness on the surface of the poly-crystal silicon is absorbed due to the fluidization of the flattened process film by the heat treatment at the bonding process. As a result, it is possible to obtain the good joined state on the surface of the poly-crystal silicon.

A second embodiment according to the present invention is explained in detail below.

FIGS. 2A to 2I show schematic producing processes of the semiconductor substrate according to the second embodiment of the present invention. In this embodiment, the different processes from the first embodiment are explained in detail hereinafter in order to simplify the explanations.

That is, the following processes, i.e., the etching process (FIG. 2A), the film-making process (FIG. 2B), the depositing process (FIG. 2C), the heat treatment process (FIG. 2D) and the polishing process (FIG. 2E), are the same as the processes shown in FIGS. 1A to 1E in the first embodiment. Although the first wafer 1, on which the polishing process (FIG. 1E) was completed, is directly provided to the bonding process (FIG. 1F) in the first embodiment, the second depositing process shown in FIG. 2F is provided in the second embodiment.

Figure 2A:
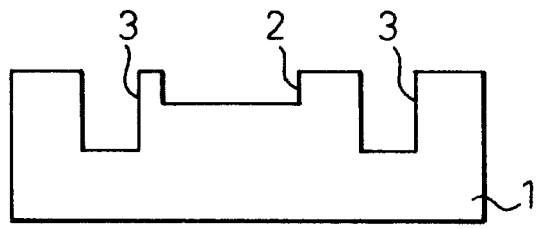
FIGS. 2A to 2I show schematic producing processes of the semiconductor substrate according to the second embodiment of the present invention.
Figure 2B:
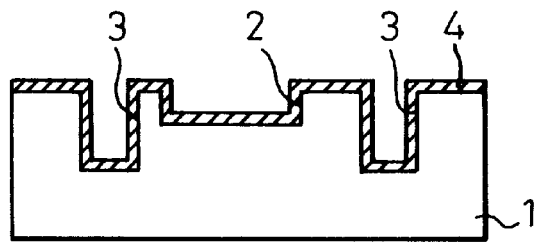
Figure 2C:
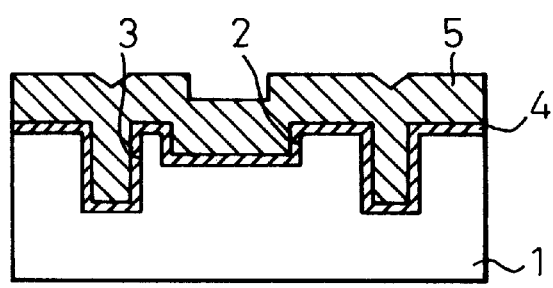
Figure 2D:
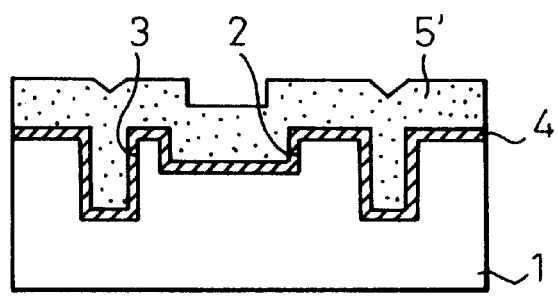
Figure 2E:
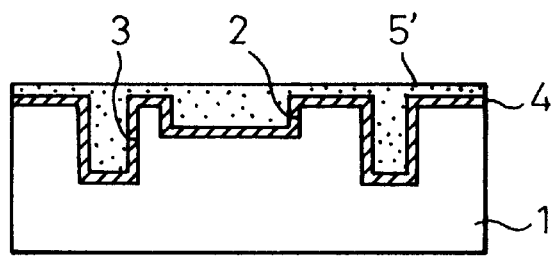
Figure 2F:
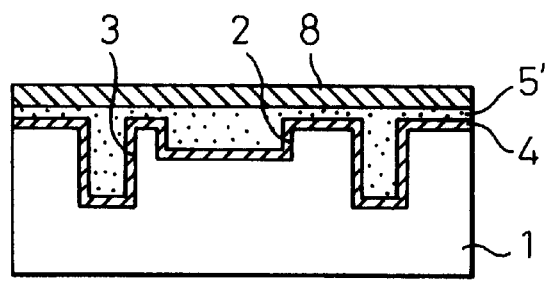

In the second depositing process shown in FIG. 2F, the second poly-crystal silicon 8 (this corresponds to the second poly-crystal silicon according to the present invention) is deposited on the surface of the poly-crystal silicon 5' by using the LPCVD method. In this deposition, it is better to perform the deposition under conditions which suppress the growth speed, i.e., the low pressure and low temperature (for example, 900° C. or less, preferably, 650° C. or less). However, it is possible to perform the deposition under conditions of normal pressure and high temperature.

After the above process, the final polishing process (not shown), in which the second poly-crystal silicon 8 is flattened (i.e., mirror-polished) through the chemical and mechanical polishing (CMP) process, is performed without the heat treatment process.

Figure 2G:
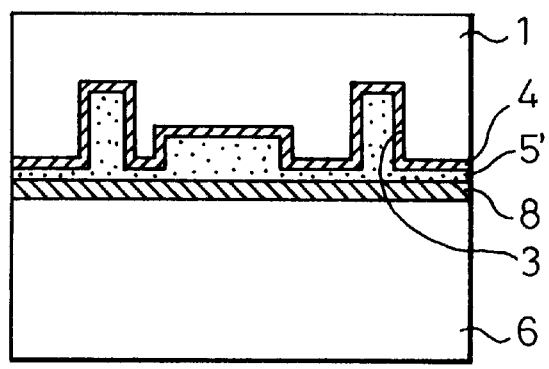
Figure 2H:
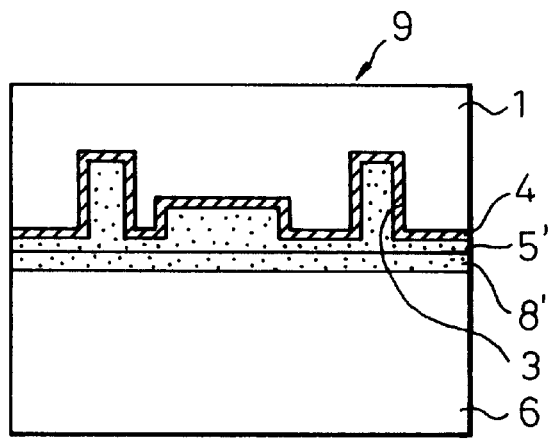

Next, the bonding process shown in FIGS. 2G and 2H is performed on the surfaces of the second poly-crystal silicon 8 and the second wafer 6 after the hydrophilic process as well as the first embodiment. In this bonding process, the surface of the first wafer 1 (i.e., the surface of the second poly-crystal silicon 8) and the surface of the second wafer 6 are closely joined to each other, and the heat treatment is performed within, for example, an inactive gas, such as nitrogen gas, or an oxidation gas, at a temperature 1100° C. per one hour.

Figure 2I:
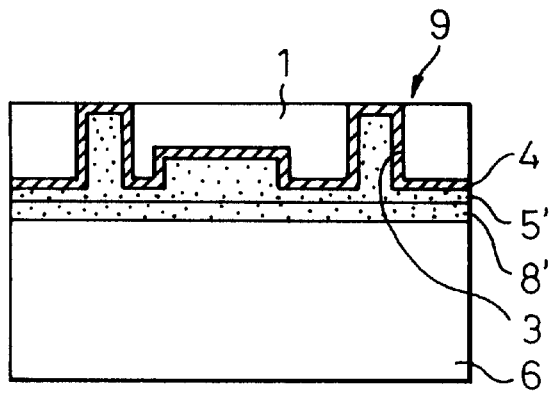

After the above process, the joined substrate 9 in which the wafers 1 and 6 are directly joined to each other, is formed. At that time, with the heat treatment, the second poly-crystal silicon 8 becomes the large particle and changes to the second poly-crystal silicon 8' having the particle-like crystal. Further, the grinding and polishing process shown in FIG. 2I is performed after the above process as well as the first embodiment.

According to this embodiment, since the heat treatment is performed during the predetermined times (e.g., 5 to 10 hours) under the temperature (e.g., 1150° C.) higher than the heat treatment temperature (e.g., 1100° C.) at the bonding process for the poly-crystal silicon 5', it is possible to suppress the reoccurrence of the unevenness caused by the large particle of the poly-crystal silicon 5 in the heat treatment at the bonding process so that it is possible to maintain the flat surface of the poly-crystal silicon 5'.

Further, although the migration occurs due to the large particle of the second poly-crystal silicon 8 in the heat treatment at the bonding process, since the lower portion of the second poly-crystal silicon 8 (i.e., the surface of the poly-crystal silicon 5') is flat, it is possible to effectively suppress the occurrence of the unevenness caused by the heat treatment at the bonding process.

Accordingly, in this embodiment, non-joined portions do not occur on the bonding surface of the first wafer 1 and the second wafer 6. As a result, when bonding the first wafer 1 and the second wafer 6, it is possible to surely prevent the occurrence of the joint failure due to the unevenness due to the pattern structure formed on the first wafer 1.

In this embodiment, although the heat treatment time at the heat treatment process is also set to the time longer than the saturation time of the migration of the poly-crystal silicon 5, it is possible to set the time shorter than the saturation time if the migration of the poly-crystal silicon 5 can be suppressed within the predetermined range.

Further, in this embodiment, before the hydrophilic process and the bonding process, it is possible to perform the forming process which forms the flattened process film having a thickness of 0.1 μm to 2 μm, on the surface of the first wafer 1 (i.e., the surface of the second poly-crystal silicon 8) or the surface of the second wafer 6.

A third embodiment according to the present invention is explained in detail below.

FIGS. 3A to 3H show schematic producing processes of the semiconductor substrate according to the third embodiment of the present invention. In this embodiment, the different processes from the first embodiment are explained in detail hereinafter in order to simplify the explanations.

That is, the following, processes, i.e., the etching process (FIG. 3A), the film-making process (FIG. 3B) and the depositing process (FIG. 3C), are the same as the processes shown in FIGS. 1A to 1C in the first embodiment. Although the heat treatment process (see FIG. 1D) at the high temperature, for example, 1150° C., was performed after the depositing process in the first embodiment, the heat treatment process shown in FIG. 3E is performed after the polishing process shown in FIG. 3D in the third embodiment.

In the polishing process, the surface of the poly-crystal silicon 5 is flattened (i.e., mirror-polished) through the chemical-mechanical polishing (CMP) process. Further, in the heat treatment process, the heat treatment at the high temperature, for example, 1150° C., is performed during the time longer than saturation time (e.g., 5 to 10 hours) of the migration of the poly-crystal silicon 5, and the poly-crystal silicon 5 becomes the large particle so that it changes to the particle crystal of the poly-crystal silicon 5'.

Figure 3A:
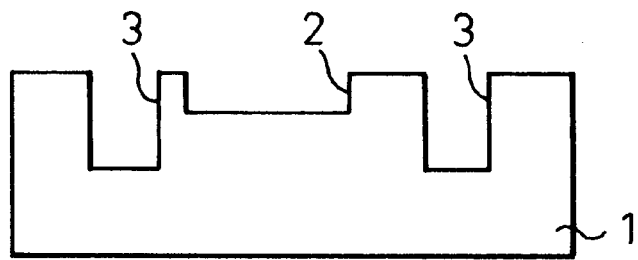
FIGS. 3A to 3H show schematic producing processes of the semiconductor substrate according to the third embodiment of the present invention.
Figure 3B:
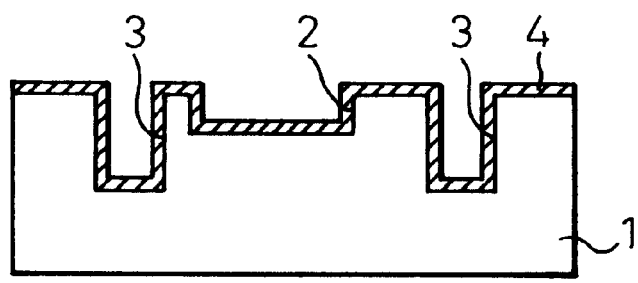
Figure 3C:
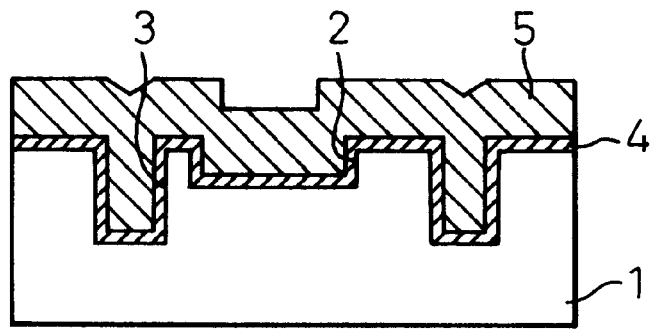
Figure 3D:
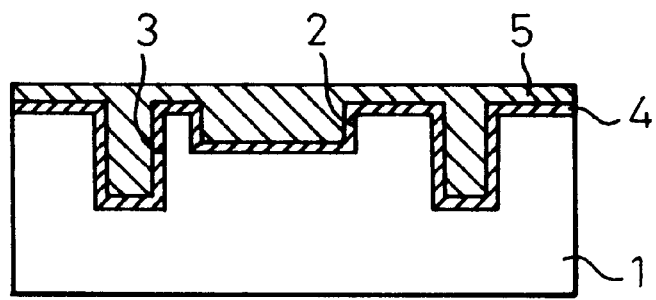
Figure 3E:
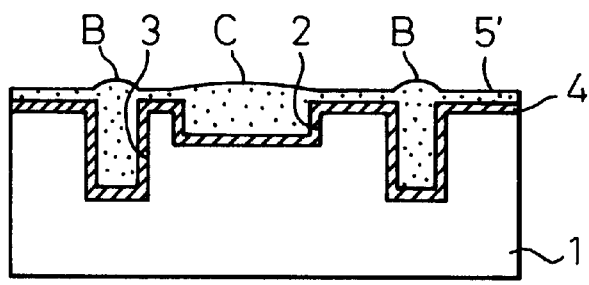
Figure 3F:
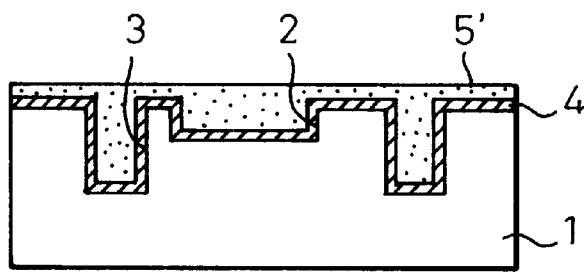

When the above heat treatment process is performed, as shown in FIG. 3E, on the surface of the poly-crystal silicon 5', a convex portion B occurs on the area corresponding to the trench 3, and a convex portion C occurs on the area corresponding to the concave portion 2. In this case, the additional polishing process shown in FIG. 3F is performed in order to eliminate the convex portions B and C so that the surface of the poly-crystal silicon 5' is again flattened (i.e., mirror-polished).

Figure 3G:
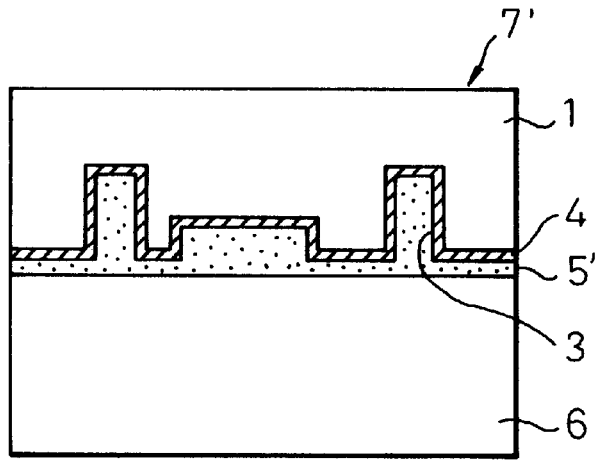
Figure 3H:
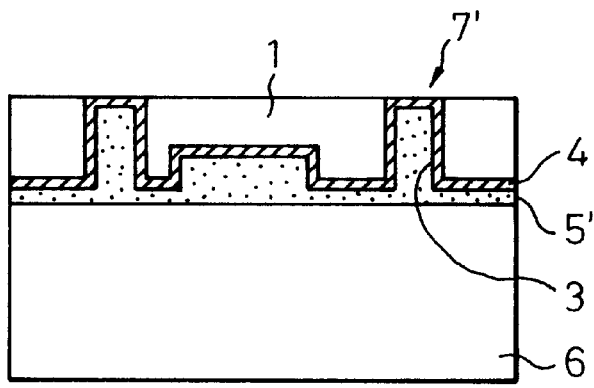

After the above process, the hydrophilic process is performed on both surfaces of the poly-crystal silicon 5' and the second wafer 6 as well as the first embodiment, and the bonding process is performed in order to form the substrate 7' as shown in FIG. 3G. Further, the grinding and polishing process is performed as well as the first embodiment as shown in FIG. 3H.

According to this embodiment, after the surface of the poly-crystal silicon 5 is once flattened by the polishing process, in the heat treatment process, the heat treatment is performed during the predetermined time (e.g., 5 to 10 hours) at the temperature (e.g., 1150° C.) higher than the heat treatment temperature (e.g., 1100° C.) at the bonding process so that the poly-crystal silicon having the large particle can be obtained. Further, in the additional polishing process, the surface of the poly-crystal silicon 5' is again flattened.

As a result, the flattened grade of the surface (i.e., the bonding surface) of the poly-crystal silicon 5' can be improved, and it is possible to suppress the reoccurrence of the unevenness caused by the large particle of the poly-crystal silicon 5' so that it is possible to maintain the flattened surface.

Accordingly, in this embodiment, non-joined portions do not occur on both bonding surfaces of the first wafer 1 and the second wafer 6. As a result, when bonding the first wafer 1 and the second wafer 6, it is possible to surely prevent the occurrence of the joint failure due to the unevenness due to the pattern structure formed on the first wafer 1.

In this embodiment, although the heat treatment time at the heat treatment process is also set to the time more than the saturation time of the migration of the poly-crystal silicon 5, it is possible to set the time shorter than the saturation time if the migration of the poly-crystal silicon 5 can be suppressed to within a predetermined range.

Further, in this embodiment, before the hydrophilic process and the bonding process, it is possible to perform the forming process which forms the flattened process film having the thickness of 0.1 μm to 2 μm, on the surface of the first wafer 1 (i.e., the surface of the poly-crystal silicon 5) or the surface of the second wafer 6.

In this embodiment, although it is not shown concretely, on the surface of the poly-crystal silicon 5' after the additional polishing process (see FIG. 3F), it is possible to perform the following processes in order, i.e., the second depositing process for depositing the second poly-crystal silicon (i.e., the second poly-crystal semiconductor) under the conditions at a temperature of 900° C. or less, preferably 650° C. or less, the final polishing process for flattening the surface of the second poly-crystal silicon after the second depositing process, and, then, the bonding process for bonding both silicon wafers as shown in FIG. 3G.

In this case, in the heat treatment at the bonding process, although the migration occurs under the large particle of the second poly-crystal silicon, since the lower portion (i.e., the surface of the poly-crystal silicon 5') of the second poly-crystal silicon is flattened, it is possible to suppress the occurrence of the unevenness caused by the heat treatment at the bonding process so that it is possible to obtain the good joined state on the surface.

In addition, although it is not shown concretely, in this embodiment, it is not necessary to perform the additional polishing process (see FIG. 3F) after the heat treatment process (see FIG. 3E), and it is possible to perform the following processes in order, i.e., the second depositing process for depositing the second poly-crystal silicon (i.e., the second poly-crystal semiconductor), the polishing process for flattening the surface of the second poly-crystal silicon after the second depositing process, and, then, the bonding process for bonding both wafers as shown in FIG. 3G.

Another embodiment according to the present invention is explained below. The present invention is not limited to the above mentioned embodiments, and it is possible to provide the following modification and enlargement.

In the above heat treatment process, although the heat treatment was performed under a temperature (e.g., 1150° C.) higher than the heat treatment temperature (e.g., 1100° C.) at the bonding process, it is possible to perform under at least the equivalent heat treatment temperature. Further, it is not necessary to set the heat treatment temperature at the bonding process to the temperature higher than 1100° C., and it is possible to achieve an initial purpose of the invention by setting the temperature higher than 1000° C.

As for the semiconductor wafer, it is not limited to the first single silicon wafer 1, and it is possible to form the wafer by the semiconductor mainly including elements at the fourth group, for example, germanium (Ge), carbonized silicon (SiC), and silicon germanium (SiGe).

As for the support substrate, it is not limited to the second single silicon wafer 6, and it is possible to use another semiconductor substrate, a ceramic or glass substrate, having an insulation property. Further, it is not limited to the SOI substrate, and it is possible to utilize the multilayer substrate in which two semiconductor substrates (i.e., the semiconductor wafer) each having different characteristics one directly bonded to each other.

We claim:

1. A method for producing a semiconductor substrate that is completed in a bonding process by closely joining a semiconductor wafer to a support substrate and heat treating the closely joined semiconductor wafer and support substrate, the method comprising:

a depositing process for depositing a poly-crystal semiconductor on a surface of the semiconductor wafer, the poly-crystal semiconductor covering all of a surface to be bonded;

a heat treatment process for heat treating the semiconductor wafer provided after the depositing process, for a predetermined time at a temperature equal to or higher than a heat treatment temperature during the bonding process; and a polishing process for flattening the surface of the poly-crystal semiconductor provided after the heat treatment process;

wherein the above processes are performed sequentially, and the bonding process is performed after the polishing process.

2. A method for producing a semiconductor substrate as claimed in claim 1, wherein, in the depositing process, the poly-crystal semiconductor is deposited at a temperature lower than the heat treatment temperature during the bonding process.

3. A method for producing a semiconductor substrate as claimed in claim 1, wherein the heat treatment time during the heat treatment process is longer than a saturation time of a migration caused by a large particle of the poly-crystal semiconductor.

4. A method for producing a semiconductor substrate as claimed in claim 1, wherein the heat treatment temperature during the bonding process is higher than 1000° C.

5. A method for producing a semiconductor substrate as claimed in claim 1, wherein both poly-crystal semiconductors provided before and after the heat treatment are formed of a poly-crystal silicon, and a temperature for depositing during the depositing process is 900° C. or less.

6. A method for producing a semiconductor substrate as claimed in claim 5, wherein the heat treatment temperature during the heat treatment process is 1150° C., and the heat treatment time is at least 5 to 10 hours.

7. A method for producing a semiconductor substrate as claimed in claim 1, wherein a forming process for providing a flattened-process film having fluidity is performed on the surface of the poly-crystal semiconductor provided after the polishing process.

8. A method for producing a semiconductor substrate as claimed in claim 1, wherein, a forming process for providing a flattened-process film having the fluidity is performed on the surface of the support substrate before the bonding process.

9. A method for producing a semiconductor substrate as claimed in claim 1, wherein the support substrate is formed of an insulating material.

10. A method for producing a semiconductor substrate that is completed in a bonding process by closely joining a semiconductor wafer to a support substrate and heat treating the closely joined semiconductor wafer and support substrate, the method comprising:

a first depositing process for depositing a poly-crystal semiconductor on a surface of the semiconductor wafer, the poly-crystal semiconductor covering all of a surface to be bonded;

a heat treatment process for heat treating the semiconductor wafer provided after the first depositing process, for a predetermined time at a temperature equal; to or higher than a heat treatment temperature during the bonding process;

a polishing process for flattening the surface of the poly-crystal semiconductor provided after the heat treatment process;

a second depositing process for depositing a second poly-crystal semiconductor on the surface of the poly-crystal semiconductor provided after the polishing process; and a final polishing process for flattening the surface of the second poly-crystal semiconductor provided after the second depositing process;

wherein the above processes are performed sequentially, and the bonding process is performed after the final polishing process.

11. A method for producing a semiconductor substrate as claimed in claim 10, wherein, in the first and second depositing processes, the poly-crystal semiconductor and the second poly-crystal semiconductor are deposited at a temperature lower than the heat treatment temperature during the bonding process.

12. A method for producing a semiconductor substrate as claimed in claim 10, wherein the heat treatment time during the heat treatment process is longer than a saturation time of a migration caused by a large particle of the poly-crystal semiconductor.

13. A method for producing a semiconductor substrate as claimed in claim 10, wherein the heat treatment temperature during the bonding process is higher than 1000° C.

14. A method for producing a semiconductor substrate as claimed in claim 10, wherein the poly-crystal semiconductors provided before and after the heat treatment, and the second poly-crystal semiconductor, are formed of a poly-crystal silicon, and a temperature for depositing during the first depositing process and a temperature for depositing during the second depositing process are both 900° or less.

15. A method for producing a semiconductor substrate as claimed in claim 14, wherein the heat treatment temperature during the heat treatment process is set to 1150° C., and the heat treatment time is at least 5 to 10 hours.

16. A method for producing a semiconductor substrate as claimed in claim 10, wherein a forming process for providing a flattened-process film having fluidity is performed on the surface of the second poly-crystal semiconductor provided after the polishing process.

17. A method for producing a semiconductor substrate as claimed in claim 10, wherein, a forming process for providing a flattened-process film having fluidity is performed on the surface of the support substrate before the bonding process.

18. A method for producing a semiconductor substrate as claimed in claim 10, wherein the support substrate is formed of an insulating material.

19. A method for producing a semiconductor substrate that is completed in a bonding process by closely joining a semiconductor wafer to a support substrate and heat treating the closely joined semiconductor wafer and support substrate, the method comprising:

a depositing process for depositing a poly-crystal semiconductor on a surface of the semiconductor wafer, the poly-crystal semiconductor covering all of a surface to be bonded;

a polishing process for flattening the surface of the poly-crystal semiconductor provided after the depositing process;

a heat treatment process for heat treating the semiconductor wafer provided after the polishing process, for a predetermined time at a temperature equal to or higher than a heat treatment temperature during the bonding process; and an additional polishing process for flattening again the surface of the poly-crystal semiconductor provided after the heat treatment process;

wherein the above processes are performed sequentially, and the bonding process is performed after the additional polishing process.

20. A method for producing a semiconductor substrate as claimed in claim 19, wherein, in the depositing process, the poly-crystal semiconductor is deposited at a temperature lower than the heat treatment temperature during the bonding process.

21. A method for producing a semiconductor substrate as claimed in claim 19, further comprising a second depositing process for depositing a second poly-crystal semiconductor on the surface of the poly-crystal semiconductor provided after the additional polishing process; and a final polishing process for flattening the surface of the second poly-crystal semiconductor of the semiconductor wafer provided after the second depositing process; wherein the above processes are performed sequentially, and the bonding process is performed after the final polishing process.

22. A method for producing a semiconductor substrate as claimed in claim 21, wherein, in the second depositing process, the second poly-crystal semiconductor is deposited at a temperature lower than the heat treatment temperature during the bonding process of the second poly-crystal semiconductor.

23. A method for producing a semiconductor substrate as claimed in claim 19, further comprising a second depositing process for depositing a second poly-crystal semiconductor on the surface of the poly-crystal semiconductor of the semiconductor wafer without the additional polishing process after the heat treatment process; and a final polishing process for flattening the surface of the second poly-crystal semiconductor of the semiconductor wafer provided after the second depositing process; wherein the above processes are performed in order, and the bonding process is performed after the final polishing process.

24. A method for producing a semiconductor substrate as claimed in claim 23, wherein, in the second depositing process, the second poly-crystal semiconductor is deposited at a temperature lower than the heat treatment temperature during the bonding process.

25. A method for producing a semiconductor substrate as claimed in claim 21, wherein the second poly-crystal semiconductor is formed of a poly-crystal silicon, and a temperature for depositing at the second depositing process is 900° C. or less.

26. A method for producing a semiconductor substrate as claimed in claim 19, wherein a forming process for providing a flattened-process film having fluidity is performed on the surface of the poly-crystal semiconductor provided after the polishing process.

27. A method for producing a semiconductor substrate as claimed in claim 21, wherein a forming process for providing a flattened process film having fluidity is performed on the surface of the second poly-crystal semiconductor provided after the final polishing process.

28. A method for producing a semiconductor substrate as claimed in claim 19, wherein a forming process for providing a flattened process film having fluidity is performed on the surface of the support substrate before the bonding process.

29. A method for producing a semiconductor substrate as claimed in claim 19, wherein the heat treatment time during the heat treatment process is longer than a saturation time of a migration caused by a large particle of the poly-crystal semiconductor.

30. A method for producing a semiconductor substrate as claimed in claim 19, wherein the heat treatment temperature during the bonding process is higher than 1000° C.

31. A method for producing a semiconductor substrate as claimed in claim 19, wherein both poly-crystal semiconductors provided before and after the heat treatment are formed of a poly-crystal silicon, and a temperature for depositing during the depositing process is 900° C. or less.

32. A method for producing a semiconductor substrate as claimed in claim 31, wherein the heat treatment temperature at the heat treatment process is set to 1150° C., and the heat treatment time is set to 5 to 10 hours or longer.

33. A method for producing a semiconductor substrate as claimed in claim 19, wherein the support substrate is formed of an insulating material.

* * * * *